(12) United States Patent
Chito et al.

(10) Patent No.: US 10,896,836 B2
(45) Date of Patent: Jan. 19, 2021

(54) ELECTROSTATIC CHUCK

(71) Applicant: DISCO CORPORATION, Tokyo (JP)

(72) Inventors: Kenta Chito, Tokyo (JP); Hidekazu Iida, Tokyo (JP); Tomohiro Yamada, Tokyo (JP); Yoshiteru Nishida, Tokyo (JP); Hiroyuki Takahashi, Tokyo (JP); Ryoko Fujiya, Tokyo (JP); Susumu Yokoo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 284 days.

(21) Appl. No.: 16/034,600

(22) Filed: Jul. 13, 2018

(65) Prior Publication Data
US 2019/0019712 A1    Jan. 17, 2019

(30) Foreign Application Priority Data

Jul. 14, 2017 (JP) ................................ 2017-137501

(51) Int. Cl.
*H01L 21/683* (2006.01)
*H01L 21/67* (2006.01)
(Continued)

(52) U.S. Cl.
CPC ...... *H01L 21/6833* (2013.01); *H01L 21/3065* (2013.01); *H01L 21/67069* (2013.01);
(Continued)

(58) Field of Classification Search
CPC ........... H01L 21/3065; H01L 21/30655; H01L 21/67063; H01L 21/67069; H01L 21/6831; H01L 21/6833; H01L 21/6835; H01L 21/6836; H01L 21/6838; H01L 21/68714; H01L 21/6875; H01L 2221/68327; H01L 2221/6834
See application file for complete search history.

(56) References Cited

U.S. PATENT DOCUMENTS

| | | | | |
|---|---|---|---|---|
| 5,745,331 A | * | 4/1998 | Shamouilian | ....... H01L 21/6831 361/234 |
| 2003/0161088 A1 | * | 8/2003 | Migita | ................ H01L 21/6831 361/234 |

(Continued)

FOREIGN PATENT DOCUMENTS

JP    2016143785 A    8/2016

*Primary Examiner* — Thienvu V Tran
*Assistant Examiner* — Ivan Laboy
(74) *Attorney, Agent, or Firm* — Greer Burns & Crain Ltd.

(57) ABSTRACT

An electrostatic chuck is provided and has a holding surface for holding a wafer with a tape attached to one side of the wafer where the tape is in contact with the holding surface. The electrostatic chuck includes a disk-shaped member having a plurality of fine holes communicating with a vacuum source, where the fine holes are exposed to the holding surface. The disk-shaped member also includes a plurality of asperities formed on the holding surface and connected to the fine holes, and an electrode embedded in the disk-shaped member. The vacuum source is operated to produce a vacuum on the holding surface through the fine holes and thereby hold the wafer through the tape on the holding surface under suction, where the asperities formed on the holding surface function as a suction passage communicating with the fine holes.

8 Claims, 3 Drawing Sheets

(51) Int. Cl.
*H01L 21/3065* (2006.01)
*H01L 21/687* (2006.01)

(52) U.S. Cl.
CPC ...... *H01L 21/6831* (2013.01); *H01L 21/6836* (2013.01); *H01L 21/6838* (2013.01); *H01L 21/6875* (2013.01); *H01L 2221/6834* (2013.01); *H01L 2221/68327* (2013.01)

(56) References Cited

U.S. PATENT DOCUMENTS

| | | | |
|---|---|---|---|
| 2005/0036267 A1* | 2/2005 | Savas | H01L 21/6838 361/234 |
| 2005/0215073 A1* | 9/2005 | Nakamura | H01L 21/6831 438/778 |
| 2006/0032583 A1* | 2/2006 | Muramoto | G02F 1/1333 156/285 |
| 2014/0204501 A1* | 7/2014 | Moriya | H01L 21/67103 361/234 |
| 2017/0057875 A1* | 3/2017 | Ishizuka | C04B 35/44 |

* cited by examiner

ELECTROSTATIC CHUCK

BACKGROUND OF THE INVENTION

Field of the Invention

The present invention relates to an electrostatic chuck.

Description of the Related Art

After grinding a wafer by using a grinding apparatus, grinding marks are left on the ground surface (work surface) of the wafer. The grinding marks cause a reduction in die strength of the wafer. To cope with this problem, there has been proposed a plasma etching apparatus for performing plasma etching to thereby remove the grinding marks from the ground surface of the wafer (see Japanese Patent Laid-open No. 2016-143785, for example). In the plasma etching apparatus, the wafer is transferred from the outside of a chamber (vacuum chamber) through a load/unload door into the chamber, and an etching gas is next supplied into the chamber in the condition where the chamber has been evacuated. The etching gas in the chamber is next dissociated into a plasma, which reacts with the wafer to thereby remove the grinding marks from the ground surface of the wafer. Thus, it is possible to suppress a reduction in die strength due to the grinding marks left on the ground surface of the wafer.

In such a plasma etching apparatus, a vacuum condition is maintained in the chamber in performing plasma etching. Accordingly, as a chuck table for holding a wafer, an electrostatic holding type chuck table generally called electrostatic chuck is adopted in place of a suction holding type chuck table.

SUMMARY OF THE INVENTION

Further, a tape as a protective member is attached to the lower surface of the wafer, and the wafer is placed through the tape on the upper surface of the electrostatic chuck. In this case, there is a case that a bubble (gap) may be formed between the tape and the electrostatic chuck. The electrostatic chuck is formed with a cooling water passage for passing a cooling water to remove the reaction heat generated by the reaction between the etching gas (plasma) and the wafer.

Accordingly, when plasma etching is performed in the condition where the bubble is formed between the tape and the electrostatic chuck, the tape is not cooled by the cooling water at the position where the bubble is formed, because the tape is not in contact with the upper surface of the electrostatic chuck at this position. As a result, the tape at this position is exposed to high temperatures. The tape has an adhesive layer, so that the adhesive layer is melted by the heat. Accordingly, when the tape is peeled from the wafer in a subsequent step, the adhesive is undesirably left on each device divided from the wafer. Further, when the tape is exposed to higher temperatures, there is a possibility that the tape may be burned to be perforated, that is, there is a possibility of so-called "tape burning."

It is therefore an object of the present invention to provide an electrostatic chuck which can suppress the generation of bubbles between the tape and the upper surface of the electrostatic chuck, thereby preventing the tape burning.

In accordance with an aspect of the present invention, there is provided an electrostatic chuck having a holding surface for holding a wafer with a tape attached to one side of the wafer in a condition where the tape is in contact with the holding surface, the tape including a base sheet and a paste layer formed on one side of the base sheet, the base sheet being formed of resin, the electrostatic chuck including: a disk-shaped member having a plurality of fine holes communicating with a vacuum source, the fine holes being exposed to the holding surface; a plurality of asperities formed on the holding surface and connected to the fine holes; and an electrode embedded in the disk-shaped member, wherein when the vacuum source is operated to produce a vacuum on the holding surface through the fine holes and thereby hold the wafer through the tape on the holding surface under suction, the asperities formed on the holding surface function as a suction passage communicating with the fine holes.

With this configuration, the asperities are formed on the holding surface of the electrostatic chuck. Accordingly, when the wafer is held through the tape on the holding surface, the generation of bubbles between the tape and the holding surface can be suppressed because the asperities are connected to the fine holes. AS a result, the tape burning can be prevented in subsequently performing given processing such as plasma etching to the wafer.

According to the present invention, the generation of bubbles between the tape and the holding surface can be suppressed to thereby prevent the tape burning.

The above and other objects, features, and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1A:
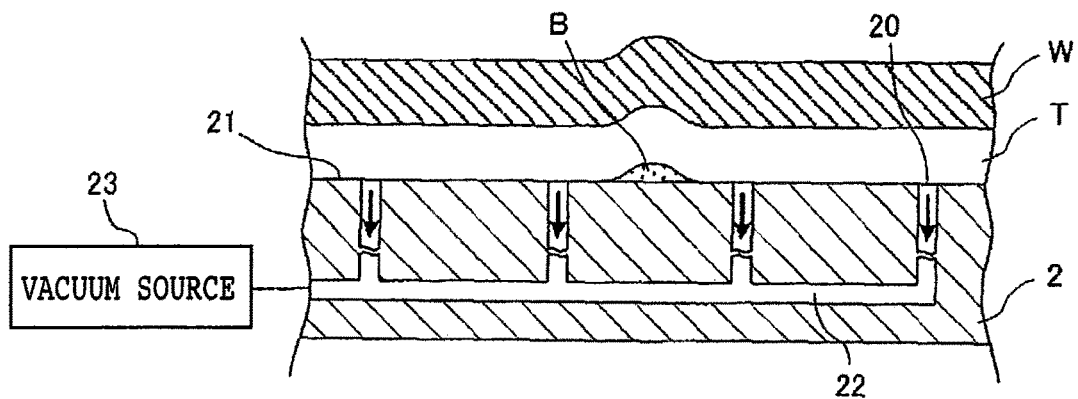
FIGS. 1A, 1B, and 1C are enlarged sectional views of an essential part of a conventional electrostatic chuck in the case that a wafer is held on the electrostatic chuck.
Figure 1B:
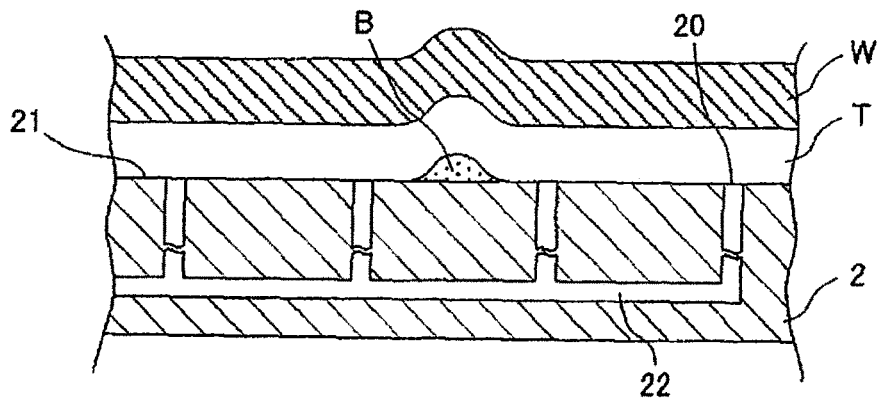
Figure 1C:
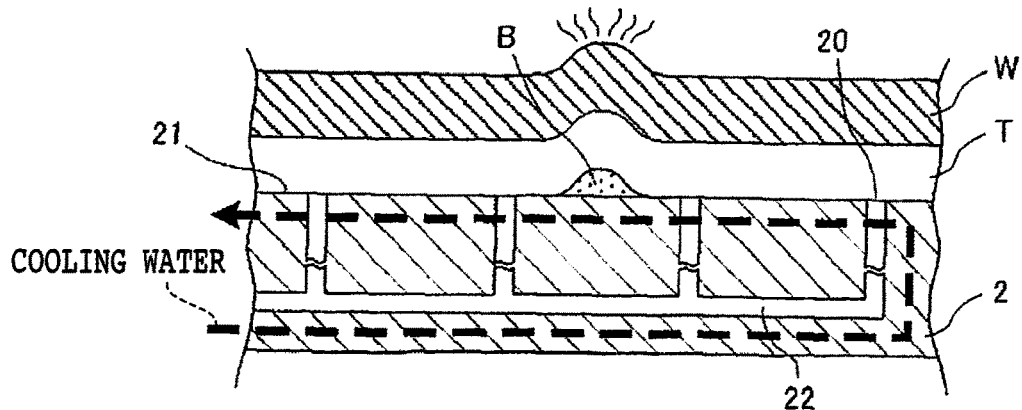

In a plasma etching apparatus, a wafer processed by grinding is held on an electrostatic chuck by electrostatic attraction. FIGS. 1A, 1B, and 1C are enlarged sectional views of an essential part of a conventional electrostatic chuck 2 in the case that a wafer W is held on the electrostatic chuck 2. FIG. 1A shows a condition that the wafer W has just been loaded into a chamber in a plasma etching apparatus, FIG. 1B shows a condition that the chamber has been evacuated, and FIG. 1C shows a condition that plasma etching is being performed in the chamber.

As shown in FIGS. 1A to 1C, the electrostatic chuck 2 is provided in a chamber C (see FIG. 2) constituting a vacuum chamber. The electrostatic chuck 2 is formed from a disk-shaped member larger in diameter than the wafer W. A plurality of fine holes 20 are formed in the disk-shaped member constituting the electrostatic chuck 2 so as to be exposed to the upper surface of the disk-shaped member, that is, the upper surface of the electrostatic chuck 2. Thus, the upper surface of the disk-shaped member having the plural fine holes 20 is formed as a holding surface 21 of the electrostatic chuck 2. That is, the plural fine holes 20 open to the holding surface 21. Further, a common communication passage 22 is formed in the disk-shaped member of the electrostatic chuck 2 so as to communicate with the plural fine holes 20. The communication passage 22 is connected to (in communication with) a vacuum source 23.

In the electrostatic chuck 2 as configured above, the wafer W is temporarily held on the holding surface 21 by a suction force produced by the vacuum source 23 as means for temporarily holding the wafer W before permanently holding the wafer W by using electrostatic attraction. More specifically, as shown in FIG. 1A, a tape T as a protective member is attached to the lower surface of the wafer W. The wafer W is placed through the tape T on the holding surface 21. Thereafter, the vacuum source 23 is operated to produce a vacuum as a suction force and thereby suck the wafer W and the tape T placed on the holding surface 21 because the plural fine holes 20 and the communication passage 22 are in communication with the vacuum source 23 and the plural fine holes 20 open to the holding surface 21. Thus, the wafer W and the tape T are held on the holding surface 21 under suction.

The plural fine holes 20 are arranged at given intervals in the disk-shaped member of the electrostatic chuck 2, so that the whole of the lower surface of the tape T (the wafer W) is not uniformly held under suction on the holding surface 21. More specifically, the periphery of each fine hole 20 is mainly held under suction on the holding surface 21. Accordingly, as shown in FIG. 1A, there is a possibility that a bubble B may be generated between the lower surface of the tape T and the holding surface 21 in the area between any adjacent ones of the plural fine holes 20. The lower surface of the tape T is flat, and is kept in close contact with the holding surface 21 in the area near each fine hole 20. Accordingly, the bubble B is hard to escape in the area between the adjacent fine holes 20.

When the bubble B is left between the tape T and the holding surface 21, the bubble B is expanded in the chamber C evacuated as shown in FIG. 1B. When plasma etching is performed in this condition where a part of the workpiece (the wafer W and the tape T) is separated from the holding surface 21, the periphery of the bubble B rises in temperature due to the heat generated in etching.

As shown in FIG. 1C, a cooling water is passed through a water jacket (not shown) formed inside the electrostatic chuck 2 during etching, thereby suppressing an abnormal rise in temperature of the electrostatic chuck 2 and the wafer W. However, as described above, the lower surface of the tape T at the position where the bubble B has been generated is not in contact with the holding surface 21, so that the tape T is not properly cooled at this noncontact position. As a result, there is a possibility that the tape T may be exposed to high temperatures in the vicinity of the bubble B and accordingly may be burned to be perforated, that is, there is a possibility of so-called "tape burning."

To suppress the generation of the bubble B causing the tape burning, it is considered to reduce the spacing between the adjacent fine holes 20 (the pitch of the fine holes 20). However, when the fine holes 20 increase in number, the number of man-hours for machining in manufacturing the electrostatic chuck 2 increases, causing an undesirable result from the viewpoint of manufacturing cost.

In the electrostatic chuck 2, the holding force can be increased by increasing the contact area between the holding surface 21 and the wafer W (the lower surface of the tape T in FIGS. 1A to 1C), so that the wafer W can be stably held on the holding surface 21 under suction. Accordingly, there is a case that the holding surface 21 of the electrostatic chuck 2 is mirror-finished.

The tape T to be attached to the wafer W is composed of a base sheet and an adhesive layer formed on the base sheet. The base sheet of the tape T is formed of resin. The hardness of the base sheet of the tape T varies with the kind of the resin. For example, the base sheet of the tape T may be formed of a relatively soft resin such as polyolefin (PO) and polyurethane (PU) or may be formed of a relatively hard resin such as polyethylene terephthalate (PET).

In the case that the base sheet of the tape T is formed of a relatively hard resin, the bubble B is hardly generated between the holding surface 21 and the tape T even in the case that the holding surface 21 of the electrostatic chuck 2 is a mirror-finished surface. Accordingly, the holding force of holding the wafer W on the holding surface 21 under suction is hardly influenced, so that the problem of tape burning mentioned above hardly occurs.

On the other hand, in the case that the base sheet of the tape T is formed of a relatively soft resin, there is a possibility that the tape T may come into close contact with the holding surface 21 as a mirror-finished surface in some area and the tape T may come into noncontact with the holding surface 21 in the other area to generate the bubble B. As a result, when the chamber of the etching apparatus is evacuated, the bubble B is expanded and there is a possibility that the tape burning may therefore be caused in performing the etching, so that the etching may not be properly performed.

To cope with this problem, the present inventors have paid attention to the roughness of the holding surface 21 of the electrostatic chuck 2 (i.e., the flatness of the holding surface 21) and have found that the generation of the bubble B between the tape T and the holding surface 21 in holding the wafer W on the holding surface 21 can be suppressed by providing roughness on the holding surface 21.

In a preferred embodiment of the present invention, there is provided an electrostatic chuck 4 (see FIGS. 2 and 3) having a rough holding surface 41 with minute marks (asperities D). That is, the holding surface 41 of the electrostatic chuck 4 is a rough surface formed by providing the minute marks. As similar to the conventional electrostatic chuck 2, the electrostatic chuck 4 has a plurality of fine holes 40, and the asperities D are in communication with the fine holes 40 to thereby form a suction passage on the holding surface 41. Accordingly, even when the bubble B is generated between the tape T and the holding surface 41, the bubble B is sucked through this suction passage to a vacuum source 43 (see FIG. 2), thus allowing the removal of the bubble B. Thus, the expansion of the bubble B generated between the lower surface of the tape T and the holding surface 41 can be suppressed to thereby prevent the tape burning in performing plasma etching later.

Figure 2:
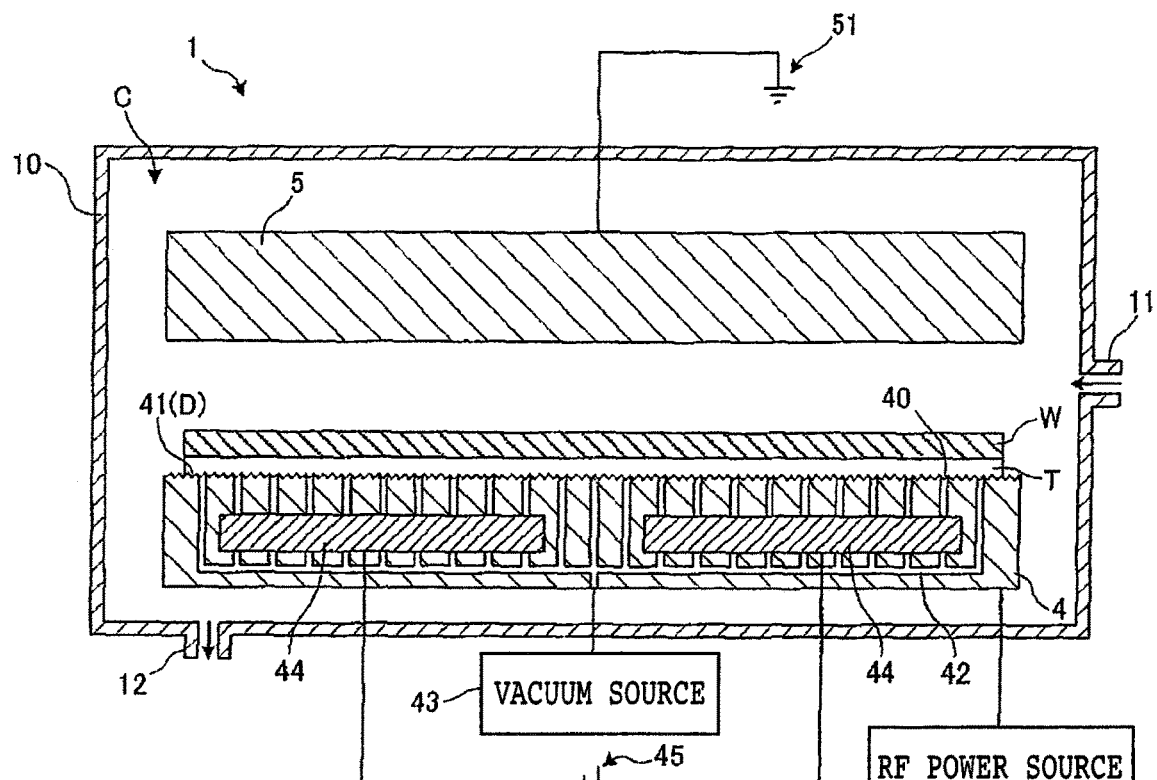
FIG. 2 is a schematic sectional view of a plasma etching apparatus including an electrostatic chuck according to a preferred embodiment of the present invention.
Figure 3:
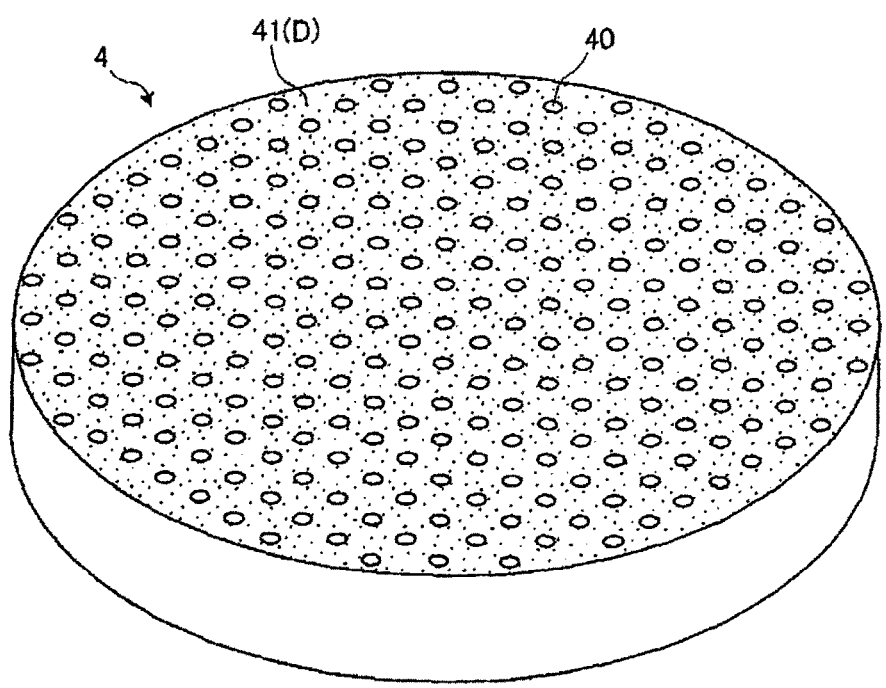
FIG. 3 is an enlarged perspective view of the electrostatic chuck shown in FIG. 2.

A plasma etching apparatus 1 according to this preferred embodiment will now be described with reference to FIGS. 2 and 3. FIG. 2 is a schematic sectional view of the plasma etching apparatus 1, and FIG. 3 is an enlarged perspective view of an electrostatic chuck 4 included in the plasma etching apparatus 1. In the following description, substantially the same parts as those shown in FIGS. 1A to 1C will be denoted by the same reference numerals for convenience of illustration.

The plasma etching apparatus 1 is of a capacitively coupled plasma (CCP) type in this preferred embodiment.

However, the plasma etching apparatus applicable in the present invention may be also of an inductively coupled plasma (ICP) type or of any other various plasma types.

As shown in FIG. 2, the plasma etching apparatus 1 includes a housing 10 for defining a predetermined vacuum chamber (chamber C), and a wafer W is processed by plasma etching to remove grinding marks. The housing 10 has a gas inlet 11 for introducing a reactant gas or the like into the chamber C before etching and a gas outlet 12 for removing the reactant gas from the chamber C after etching. There are provided in the chamber C the electrostatic chuck 4 as a lower electrode unit for forming an electric field and an upper electrode unit 5 vertically opposed to the electrostatic chuck 4 with a predetermined spacing defined therebetween.

The wafer W as a workpiece is a substantially disk-shaped semiconductor wafer formed of silicon (Si) or gallium arsenide (GaAs), for example. A tape T as a protective member is attached to the lower surface of the wafer W as viewed in FIG. 2. The wafer W is not limited to such a semiconductor wafer in the present invention, but any wafer to be held on the electrostatic chuck 4 may be used. For example, the wafer W may be an optical device wafer formed of sapphire or silicon carbide.

Although not shown, the tape T is an adhesive tape composed of a base sheet and an adhesive layer (paste layer) formed on one side of the base sheet (the upper surface of the base sheet as viewed in FIG. 2). The base sheet is formed of resin. For example, the base sheet is formed of a relatively soft resin such as polyolefin (PO) and polyurethane (PU). However, the resin forming the base sheet is not limited to a relatively soft resin, but may be suitably changed.

As shown in FIGS. 2 and 3, the electrostatic chuck 4 is a disk-shaped member larger in diameter than the wafer W. The electrostatic chuck 4 is formed of ceramic, for example. The electrostatic chuck 4 has a plurality of fine holes 40 (suction holes), which are exposed to the upper surface as a holding surface 41. The plural fine holes 40 are formed in an area radially inside the outer circumference of the wafer W and arranged at given intervals. The electrostatic chuck 4 further has a common communication passage 42 communicating with the plural fine holes 40. The common communication passage 42 is connected through a valve (not shown) to a vacuum source 43. That is, the plural fine holes 40 are in communication with the vacuum source 43.

Further, the holding surface 41 has a plurality of (numerous) minute asperities (marks) D formed by blasting, lapping, or grinding, for example. In the case of adopting grinding to form the asperities D, the grinding marks formed by grinding are crossed to form the asperities D. That is, the holding surface 41 is a rough surface having a predetermined roughness provided by the numerous asperities D. The roughness of the holding surface 41 may be suitably changed to such an extent that no bubble is generated between the tape T and the holding surface 41 and that the holding force for holding the wafer W under suction is not reduced. As described later in detail, the asperities D are in communication with the plural fine holes 40 and a suction passage is accordingly formed on the holding surface 41 i.e., many pits formed by the asperities D are in communication with the plural fine holes 40 to thereby define a suction passage between the tape T and the rough holding surface 41.

In the electrostatic chuck 4, the air present on the holding surface 41 is sucked through the plural fine holes 40 and the communication passage 42 to the vacuum source 43, thereby producing a vacuum (suction force) on the holding surface 41. Accordingly, the wafer W can be temporarily held on the holding surface 41 under suction.

The electrostatic chuck 4 further includes a pair of electrodes (lower electrodes) 44. The pair of electrodes 44 are embedded in the disk-shaped member constituting the electrostatic chuck 4 in an almost all area below the holding surface 41. Each electrode 44 is connected to a DC power source 45. Accordingly, DC power is applied from the DC power source 45 to the pair of electrodes 44, thereby generating static electricity on the holding surface 41. Accordingly, the wafer W can be electrostatically held on the holding surface 41, that is, the wafer W can be permanently held on the holding surface 41 by electrostatic attraction. Each electrode 44 may have a unipolar structure or a bipolar structure.

The electrostatic chuck 4 is connected to an RF power source 46. On the other hand, the upper electrode unit 5 is connected to a ground 51. The upper electrode unit 5 has a lower surface opposed to the upper surface of the wafer W held on the electrostatic chuck 4.

Figure 4A:
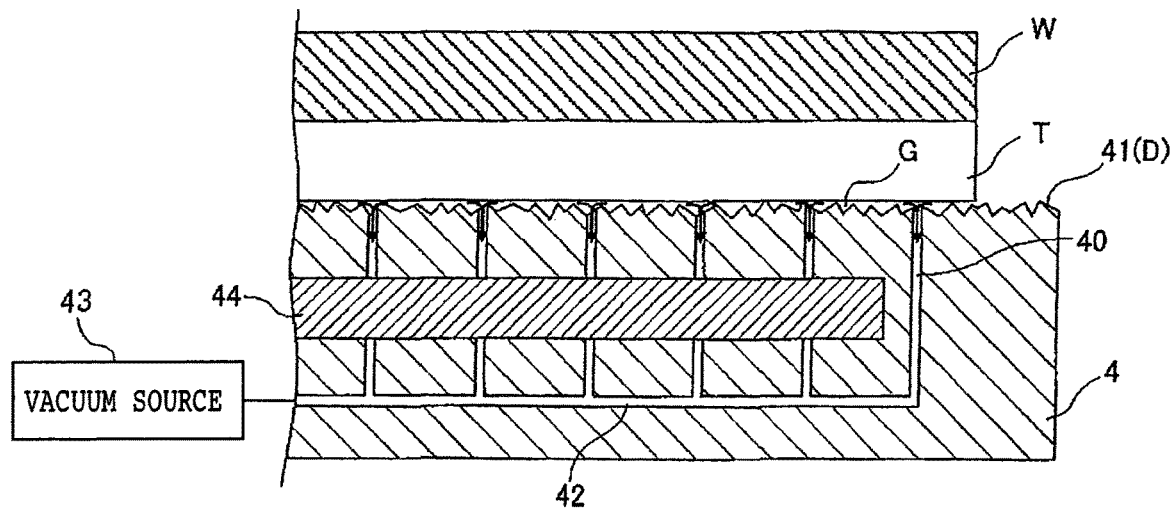
FIGS. 4A and 4B are enlarged sectional views showing the process of holding a wafer on the electrostatic chuck under suction according to this preferred embodiment.
Figure 4B:
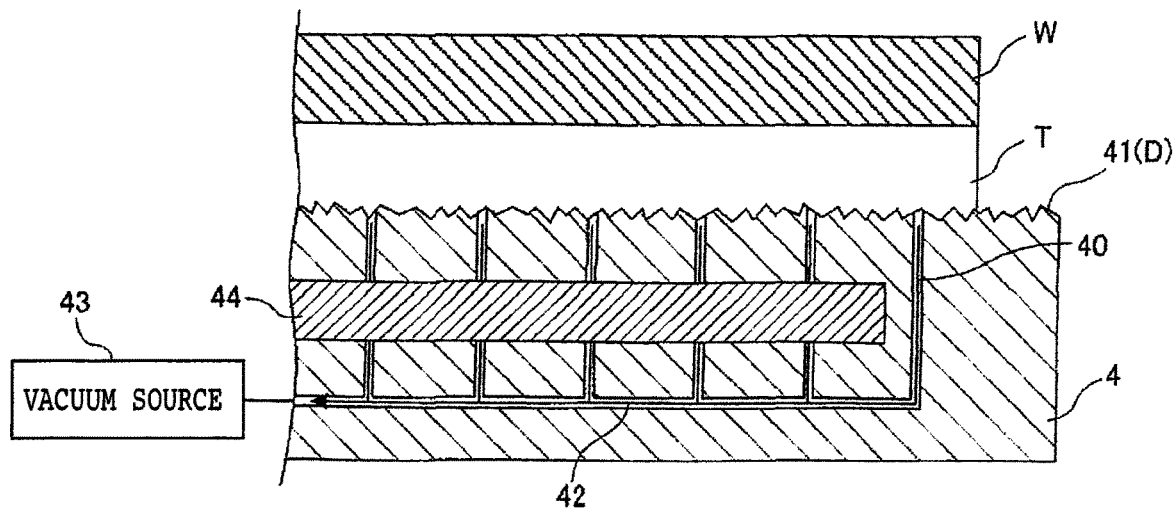

The operation of the plasma etching apparatus 1 according to this preferred embodiment will now be described with reference to FIG. 2 and FIGS. 4A and 4B. FIGS. 4A and 4B are schematic sectional views showing the process of holding the wafer W through the tape T on the electrostatic chuck 4 under suction. More specifically, FIG. 4A shows a condition that the wafer W is placed on the holding surface 41 of the electrostatic chuck 4, and FIG. 4B shows a condition that the wafer W is held on the holding surface 41 under suction by operating the vacuum source 43 after the condition shown in FIG. 4A.

In the operation of the plasma etching apparatus 1, the following three steps are performed to remove the grinding marks left on the ground surface of the wafer W. That is, a plasma etching method using the plasma etching apparatus 1 includes a suction holding step (temporary holding step) of holding the wafer W on the electrostatic chuck 4 under suction, an electrostatic holding step (permanent holding step) of holding the wafer W on the electrostatic chuck 4 by electrostatic attraction, and a plasma etching step of plasma-etching the exposed surface (upper surface or ground surface) of the wafer W.

The suction holding step is first performed. As shown in FIG. 2, the wafer W is transferred by any transfer means (not shown) into the chamber C of the plasma etching apparatus 1. More specifically, the wafer W is placed through the tape T on the holding surface 41 in such a manner that the center of the wafer W coincides with the center of the holding surface 41 of the electrostatic chuck 4.

As described above, the holding surface 41 has the numerous asperities D. As shown in FIG. 4A, when the wafer W is placed on the holding surface 41, slight gaps G (pits) are formed by the numerous asperities D between the lower surface of the tape T and the holding surface 41. The gaps G are connected to the plural fine holes 40. That is, the gaps G constitute the suction passage formed on the holding surface 41 due to the asperities D.

Accordingly, the gaps G are in communication with the plural fine holes 40 and the communication passage 42 connected to the vacuum source 43. When the vacuum source 43 is operated, the air present on the holding surface 41 is sucked by the vacuum source 43 to thereby produce a vacuum (suction force) on the holding surface 41. At this time, the vacuum is also produced in the gaps G, so that the tape T formed of a relatively soft resin is sucked to the holding surface 41 by the vacuum.

As a result, the lower surface of the tape T is brought into close contact with the holding surface 41 so as to follow the uneven shape of the holding surface 41 as shown in FIG. 4B. In this manner, the tape T is brought into close contact with the holding surface 41 so as to fill the gaps G. Accordingly, the bubble is hardly generated between the tape T and the holding surface 41. Even when the bubble is generated between the tape T and the holding surface 41, the bubble generated can be gradually sucked off through the gaps G as the suction passage during the suction operation by the vacuum source 43. As a result, the bubble can be finally removed.

As described above, the asperities D are intentionally formed on the holding surface 41 (i.e., the holding surface 41 is intentionally marked) to thereby form a suction passage on the holding surface 41, so that the asperities D are used as the suction passage in holding the wafer W through the tape T on the holding surface 41 under suction. With this configuration, the generation of bubbles between the tape T and the holding surface 41 can be minimized. Further, whether or not the bubble generated has been removed may be determined by monitoring a suction period or a suction pressure or by making a visual check or the like. Thusly, the wafer W can be temporarily held on the holding surface 41.

After performing the suction holding step, the electrostatic holding step is performed in the following manner. In the electrostatic holding step, the suction holding of the wafer W on the holding surface 41 by the vacuum source 43 is canceled. Thereafter, DC power is supplied from the DC power source 45 to the pair of electrodes 44, thereby producing static electricity on the holding surface 41. Accordingly, the wafer W is held through the tape T on the holding surface 41 by electrostatic attraction (by an electrostatic force). Thus, the suction holding of the wafer W by the vacuum source 43 is smoothly changed to the electrostatic holding of the wafer W by electrostatic attraction. Accordingly, the wafer W can be permanently held on the holding surface 41 in the condition where the tape T is in close contact with the holding surface 41 without the bubble therebetween as shown in FIG. 4B.

After performing the electrostatic holding step, the plasma etching step is performed in the following manner. In the plasma etching step, the chamber C is evacuated and a reactant gas is next introduced from the gas inlet 11 into the chamber C. Since the generation of the bubble is suppressed in the suction holding step as mentioned above, the expansion of the bubble due to the evacuation of the chamber C can be eliminated. A fluorine-based stable gas is used as the reactant gas in this preferred embodiment. Examples of the fluorine-based stable gas include sulfur hexafluoride (SF6), carbon tetrafluoride (CF4), and nitrogen trifluoride (NF3).

In the condition where the reactant gas is supplied so as to cover the wafer W, an RF voltage is applied between the electrostatic chuck 4 and the upper electrode unit 5 by operating the RF power source 46, thereby dissociating the reactant gas into a plasma (radicals). Accordingly, the ground surface (exposed surface) of the wafer W is etched by the plasma of the reactant gas, thus performing dry etching (isotropic etching) due to a radical chain reaction. As a result, the grinding marks left on the ground surface of the wafer W can be removed to thereby improve the die strength. As described above, no bubble is generated between the tape T and the holding surface 41. Accordingly, there is no possibility of tape burning in the plasma etching step. As a modification, a plurality of gas discharge openings may be formed on the lower surface of the upper electrode unit 5, so as to supply the reactant gas from the lower surface of the upper electrode unit 5.

According to this preferred embodiment, the holding surface 41 of the electrostatic chuck 4 is intentionally marked to form the numerous irregular asperities D. Accordingly, even when the lower surface of the tape T is sucked by the vacuum produced on the holding surface 41, the slight gaps G due to the asperities D can be connected to the fine holes 40, and the gaps G between the tape T and the holding surface 41 can be sucked by the vacuum. Accordingly, the generation of the bubble between the lower surface of the tape T and the holding surface 41 can be suppressed. Even if the bubble is generated, the bubble can be removed through the gaps G due to the asperities D as a suction passage. Accordingly, the plasma etching step is performed in the condition where no bubble is present between the tape T and the holding surface 41, so that the tape burning can be prevented. Further, it is not necessary to increase the number of the fine holes 40, so as to prevent the generation of bubbles. Accordingly, any existing configuration can be used to thereby prevent an increase in cost.

While the electrostatic chuck 4 is included in the plasma etching apparatus 1 in the above preferred embodiment, this configuration is merely illustrative. That is, the electrostatic chuck according to the present invention can be applied to any apparatus.

The steps of the plasma etching method mentioned above are merely illustrative, and the operation of the plasma etching apparatus 1 and the operation of an operator in each step may be suitably changed in sequence. Further, each step may be performed in a fully automated manner or may be manually performed by the operator.

Further, while the base sheet of the tape T is formed of a relatively soft resin such as polyolefin (PO) and polyurethane (PU) in the above preferred embodiment, this configuration is merely illustrative. The base sheet of the tape T may be formed of a relatively hard resin such as polyethylene terephthalate (PET). In this case, when the tape T is sucked to the holding surface 41, the lower surface of the tape T is not brought into close contact with the holding surface 41. That is, unlike the condition shown in FIG. 4B, the lower surface of the tape T does not follow the asperities D of the holding surface 41.

However, the wafer W is held through the tape T on the holding surface 41 under suction in the condition where the slight gaps G defined between the lower surface of the tape T and the holding surface 41 is maintained. Accordingly, the generation of bubbles can be suppressed by the presence of the slight gaps G. Even if bubbles are generated between the tape T and the holding surface 41, the bubbles generated can be gradually sucked off through the gaps G as a suction passage during the operation of the vacuum source 43. As a result, the bubbles generated can be finally removed. In this manner, according to the electrostatic chuck 4 mentioned above, the generation of bubbles can be suppressed regardless of the material of the tape T, that is, regardless of the hardness of the tape T.

Further, the above preferred embodiment and various modifications may be combined generally or partially to perform other preferred embodiments.

Further, the present invention is not limited to the above preferred embodiment and modifications mentioned above, but various modifications, replacements, and changes may be made within the scope of the present invention. Further, if the technical idea of the present invention can be realized by any other methods using any technical progress or derivative techniques, the present invention may be embodied by using these methods. Accordingly, the present invention claimed herein is intended to cover all embodiments that may fall within the scope of the present invention.

As described above, the present invention has an effect that the tape burning can be prevented. In particular, the present invention is useful as an electrostatic chuck applicable to a plasma etching apparatus.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. An electrostatic chuck having a holding surface for holding a wafer with a tape attached to one side of the wafer in a condition where the tape is in contact with the holding surface, the tape including a base sheet and a paste layer formed on one side of the base sheet, the base sheet being formed of resin, the electrostatic chuck comprising:
    a disk-shaped member having a plurality of fine holes communicating with a vacuum source, said fine holes being exposed to the holding surface;
    a plurality of asperities formed on the holding surface and connected to said fine holes, said plurality of asperities having a predetermined roughness configured for eliminating bubbles between the tape and the holding surface; and
    an electrode embedded in said disk-shaped member;
    wherein when said vacuum source is operated to produce a vacuum on the holding surface through said fine holes and thereby hold the wafer through the tape on the holding surface under suction, said asperities formed on the holding surface function as a suction passage communicating with said fine holes.

2. The electrostatic chuck according to claim 1, wherein said asperities extend beyond an outer peripheral edge of the wafer when the wafer is on the holding surface.

3. The electrostatic chuck according to claim 1, wherein said asperities have an irregular shape.

4. The electrostatic chuck according to claim 1, further comprising a pair of electrodes embedded in said disk-shaped member.

5. The electrostatic chuck according to claim 4, wherein said pair of electrodes each have a unipolar structure.

6. The electrostatic chuck according to claim 4, wherein said pair of electrodes each have a bipolar structure.

7. The electrostatic chuck according to claim 1, wherein said electrode has a unipolar structure or a bipolar structure.

8. The electrostatic chuck according to claim 1, wherein said asperities extend across an entire width of the holding surface.

* * * * *